United States Patent
Minami et al.

(10) Patent No.: US 6,910,202 B2
(45) Date of Patent: Jun. 21, 2005

(54) LOGIC SYNTHESIS DEVICE AND LOGIC SYNTHESIS METHOD

(75) Inventors: Hidetaka Minami, Kanagawa (JP); Takamitsu Yamada, Kanagawa (JP); Yasutaka Tsukamoto, Kanagawa (JP)

(73) Assignee: Ricoh Company, Ltd. (JP)

( * ) Notice: Subject to any disclaimer, the term of this patent is extended or adjusted under 35 U.S.C. 154(b) by 0 days.

(21) Appl. No.: 10/118,254

(22) Filed: Apr. 9, 2002

(65) Prior Publication Data

US 2002/0162087 A1 Oct. 31, 2002

(30) Foreign Application Priority Data

Apr. 10, 2001 (JP) ........................................ 2001-111384

(51) Int. Cl.$^7$ .............................................. G06F 17/50
(52) U.S. Cl. ............................... 716/18; 716/11; 716/8; 716/9
(58) Field of Search ............................... 111/18; 716/4, 716/5, 6, 18, 8, 9, 11

(56) References Cited

U.S. PATENT DOCUMENTS 6,173,435 B1 * 1/2001 Dupenloup .................. 716/18
6,295,636 B1 * 9/2001 Dupenloup .................. 716/18

FOREIGN PATENT DOCUMENTS

JP  2000-231583  8/2000

* cited by examiner

Primary Examiner—Vuthe Siek
Assistant Examiner—Sun James Lin
(74) Attorney, Agent, or Firm—Dickstein Shapiro Morin & Oshinsky LLP

(57) ABSTRACT

An analysis part analyzes a description of a logic design; an extraction part extracts a part of the description of the logic design having a fan-out number beyond a predetermined value, based on the analysis; an insertion part inserts a buffer for clock tree synthesis for performing an adjustment on the part extracted by said extracting part, the adjustment being performed at a time of subsequent layout process; and a logic synthesis part performs logic synthesis on the description of the logic design obtained after the insertion performed by said inserting part.

8 Claims, 6 Drawing Sheets

FIG.3

```
1   module sample(sel, in1, in2, in3, ij4, out1, out2, out3);
2   input[1:0]sel;
3   input[63:0] in1;
4   input[63:0] in2;
5   input[63:0] in3;
6   input[63:0] in4;
7   output[63:0] out1;
8   output[63:0] out2;
9   output[63:0] out3;
10
11  reg[63:0] out1;
12  reg[63:0] out2;
13  reg[63:0] out3;
14
15  always@(sel or in1 or in2 or in3 or in4)
16    case(sel)
17      2' h0: begin
18        out1 = in1;
19        out2 = in2;
20        out3 = in3;
21      end
22      2' h1: begin
23        out1 = in2;
24        out2 = in3;
25        out3 = in4;
26      end
27      2' h2: begin
28        out1 = in3;
29        out2 = in4;
30        out3 = in1;
31      end
32      2' h3: begin
33        out1 = in4;
34        out2 = in1;
35        out3 = in2;
36      end
37    endcase
38  endmodule
```

LOGIC SYNTHESIS DEVICE AND LOGIC SYNTHESIS METHOD

BACKGROUND OF THE INVENTION

1. Field of the Invention

The present invention relates to a logic synthesis device and a logic synthesis method for performing logic synthesis and layout on an LSI (Large Scale Integration) circuit design.

2. Description of the Related Art

An LSI circuit design technique includes a process of logic synthesis, and, for a part having the large number of fan-out, buffering is performed for the purpose of load sharing. Then, a layout process is proceeded to.

Moreover, in the process of logic synthesis, a high drive cell is mapped onto a part where improvement in speed of processing timing is desired greatly, and then, the layout process is proceeded to.

Such a technology is disclosed in Japanese laid-open patent application No. 2000-231583 by NEC Corp. In this technology, when logic synthesis is performed considering a conventional floor-planning, replacing a logic cell with a high drive cell for delay adjustment is not performed, but a delay improvement is made by inserting a buffer for the adjustment automatically in consideration of the number of fan-out, from information on a temporary floor planning.

However, even when using the above-mentioned conventional technique, there is no guarantee of achieving timing convergence positively after wiring at a time of layout. Moreover, since a buffer for fan-out adjustment is inserted at a time of logic synthesis, wiring efficiency may become degraded at the time of layout.

SUMMARY OF THE INVENTION

According to the present invention, insertion of a buffer is not performed for load sharing at a time of logic synthesis, but instead, a hardware description language RTL (Register Transfer Level) is analyzed, a high fan-out net is extracted therefrom, and, therefor, a buffer considering clock tree generation performed at a time of layout is inserted, to the RTL.

Moreover, a library used for the logic synthesis is analyzed, it is assumed that timing violation will remain after the layout, and, in order to leave a room for performing timing adjustment in that case, a cell having a high driving capability is not used at the time of logic synthesis. Thereby, a room of improvement on the layout is provided previously at the time of logic synthesis.

Thereby, cell arrangement and optimum load sharing in consideration of wiring area can be performed with a layout tool, unnecessary load sharing is avoided at the time of logic synthesis, and the problem in that wiring is crowded so that the layout cannot be performed properly can be prevented.

Moreover, for a circuit part severe in terms of timing, since a high drive cell is not used at the time of logic synthesis as mentioned above, the high drive cell can be used after the layout. Thus, by performing re-mapping of the high drive cell, the problem in that wiring detours and, thus, timing convergence cannot be achieved sufficiently can be prevented.

For this purpose, according to the present invention, an analysis part analyzing the description of logic design; an extraction part extracting a circuit part having the fan-out number beyond a predetermined value based on the analysis; and an insertion part inserting a buffer considering clock trees synthesis for performing an adjustment on the extracted part, the adjustment being actually performed at the time of layout.

Further, it is preferable that the above-mentioned analysis part analyzes an HDL description, and the above-mentioned extraction part extracts a high fan-out net therefrom.

Furthermore, it is also preferable that the above-mentioned insertion part inserts a buffer considering clock tree generated at the time of layout into the high fan-out net extracted by the above-mentioned extraction part.

Furthermore, it is also preferable to analyze a library used for the logic synthesis, and to further provide a cell selecting part causing the logic synthesis to be performed only on a cell having a driving capability below a predetermined value.

BRIEF DESCRIPTION OF THE DRAWINGS

Other objects and further features of the present invention will become more apparent from the following detailed description when read in conjunction with the following accompanying drawings:

FIG. 3 illustrates an example of an RTL description whose fan-out number is large;

DETAILED DESCRIPTION OF THE PREFERRED EMBODIMENT

Figure 1:
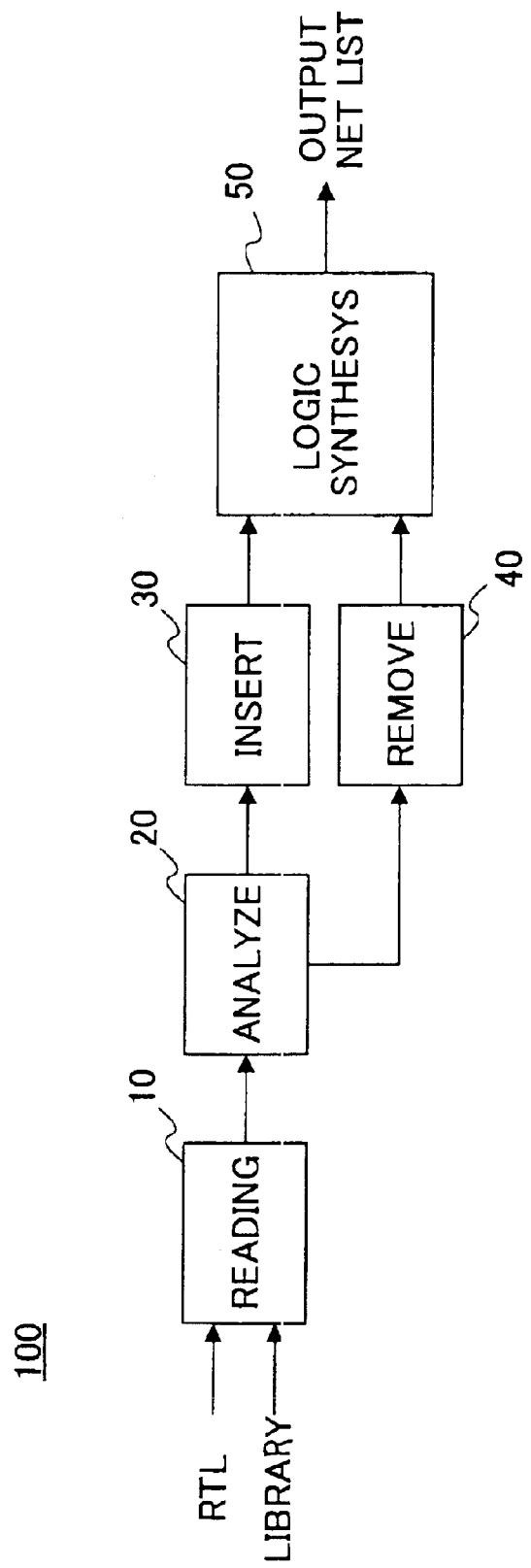
FIG. 1 shows a block diagram of a logic synthesis device in one embodiment of the present invention.
Figure 2:
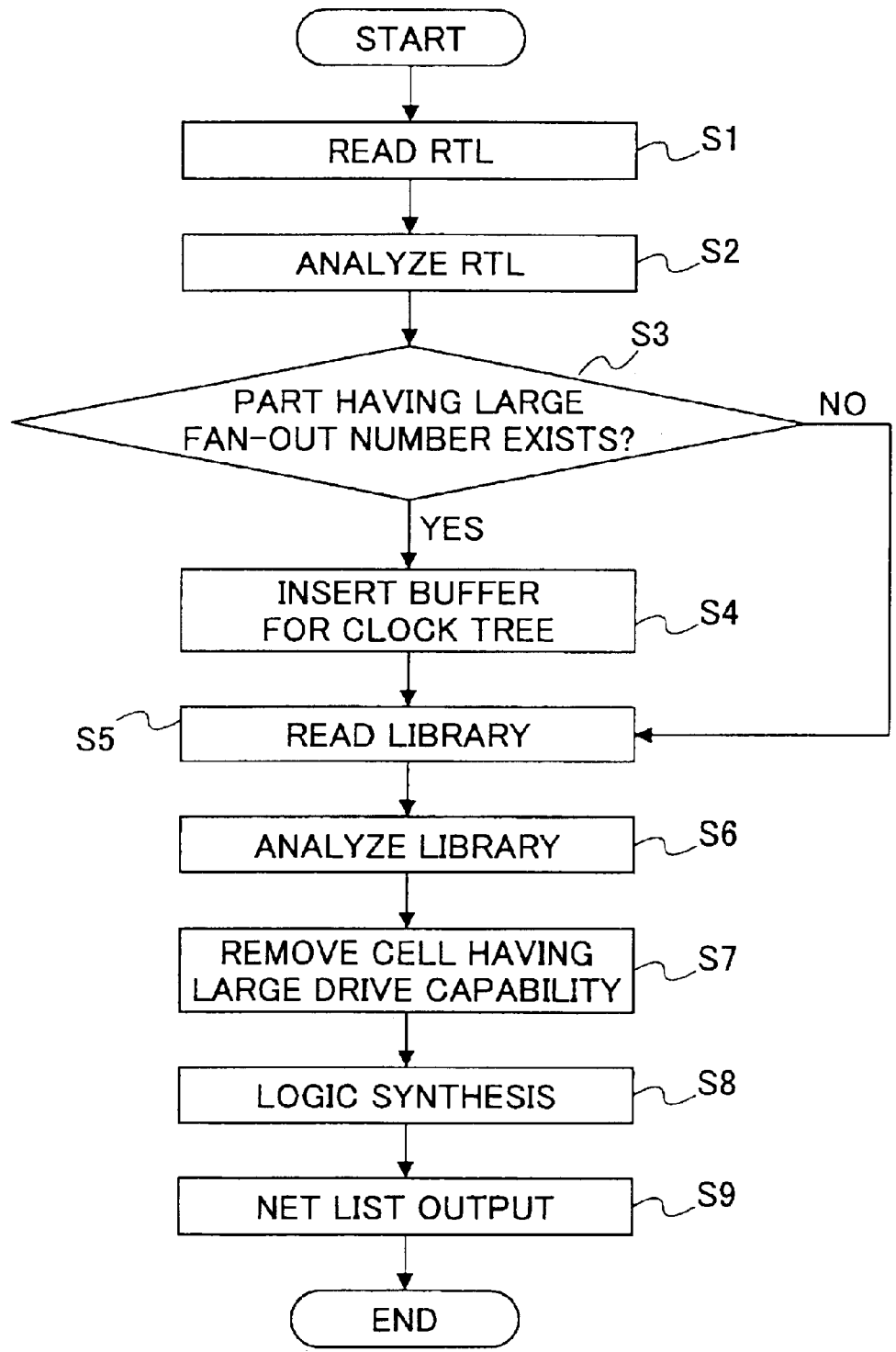
FIG. 2 shows a flow chart illustrating operation of the logic synthesis device shown in FIG. 1.

A block diagram of a logic synthesis device in one embodiment of the present invention is shown in FIG. 1. A processing flow in the logic synthesis device shown in FIG. 1 is shown in FIG. 2.

First, an RTL which a designer creates is read by a reading part 10 of the logic synthesis device 100 in the embodiment of the present invention, in a step S1. Next, the RTL thus read by the reading part 10 is analyzed by an analyzing part 20 by using a PLI (Programmable Language Interface) on Verilog in a step S2. Then, a description part of the RTL where the fan-out number increases is searched for by this analyzing part in a step S3. FIG. 3 illustrates an example of a description which will result in increase in the fan-out number.

Figure 4:
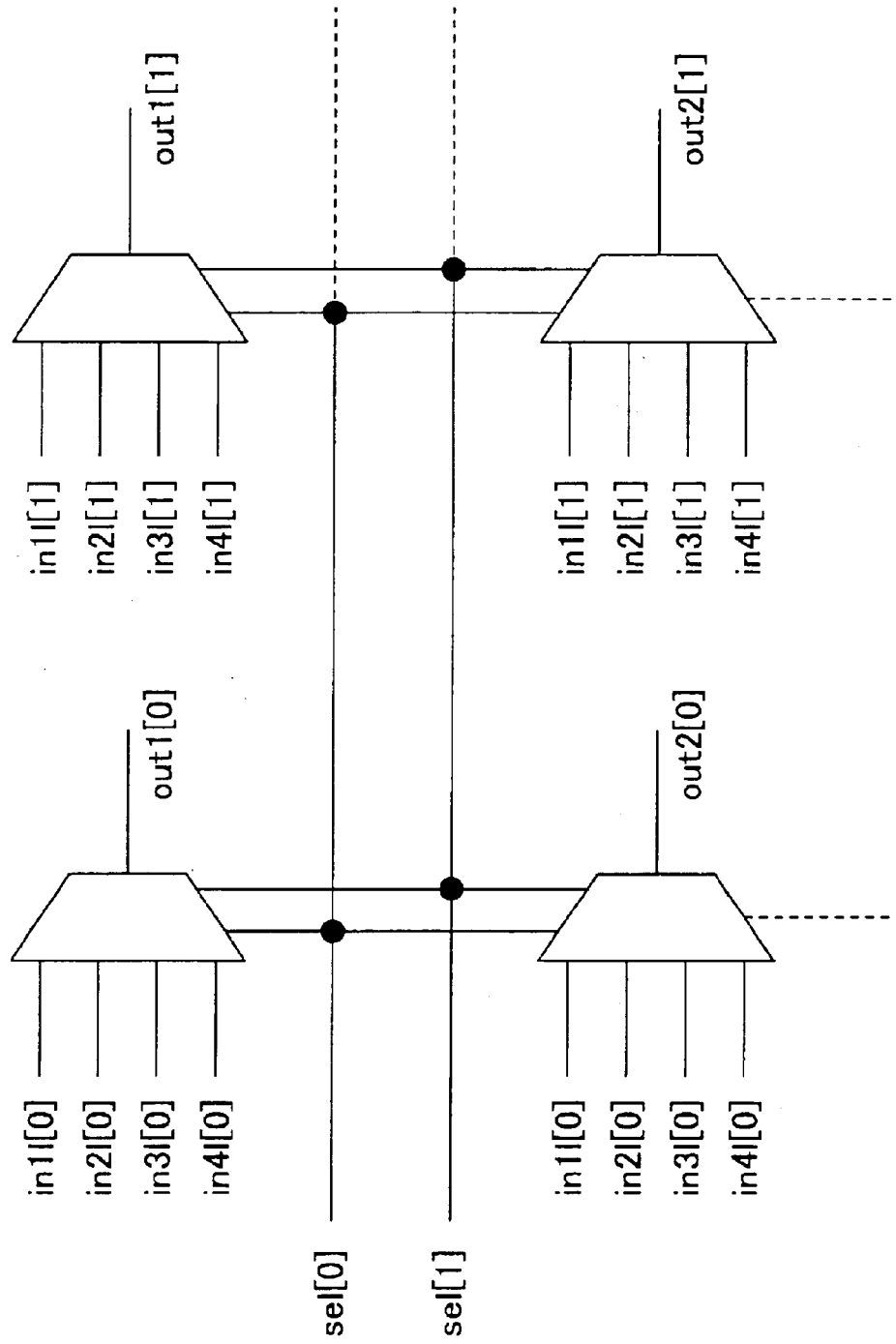
FIG. 4 shows a circuit diagram of one example of circuit configuration of an LSI circuit for which logical synthesis is performed by means of the logic synthesis device shown in FIG. 1.
Figure 5:
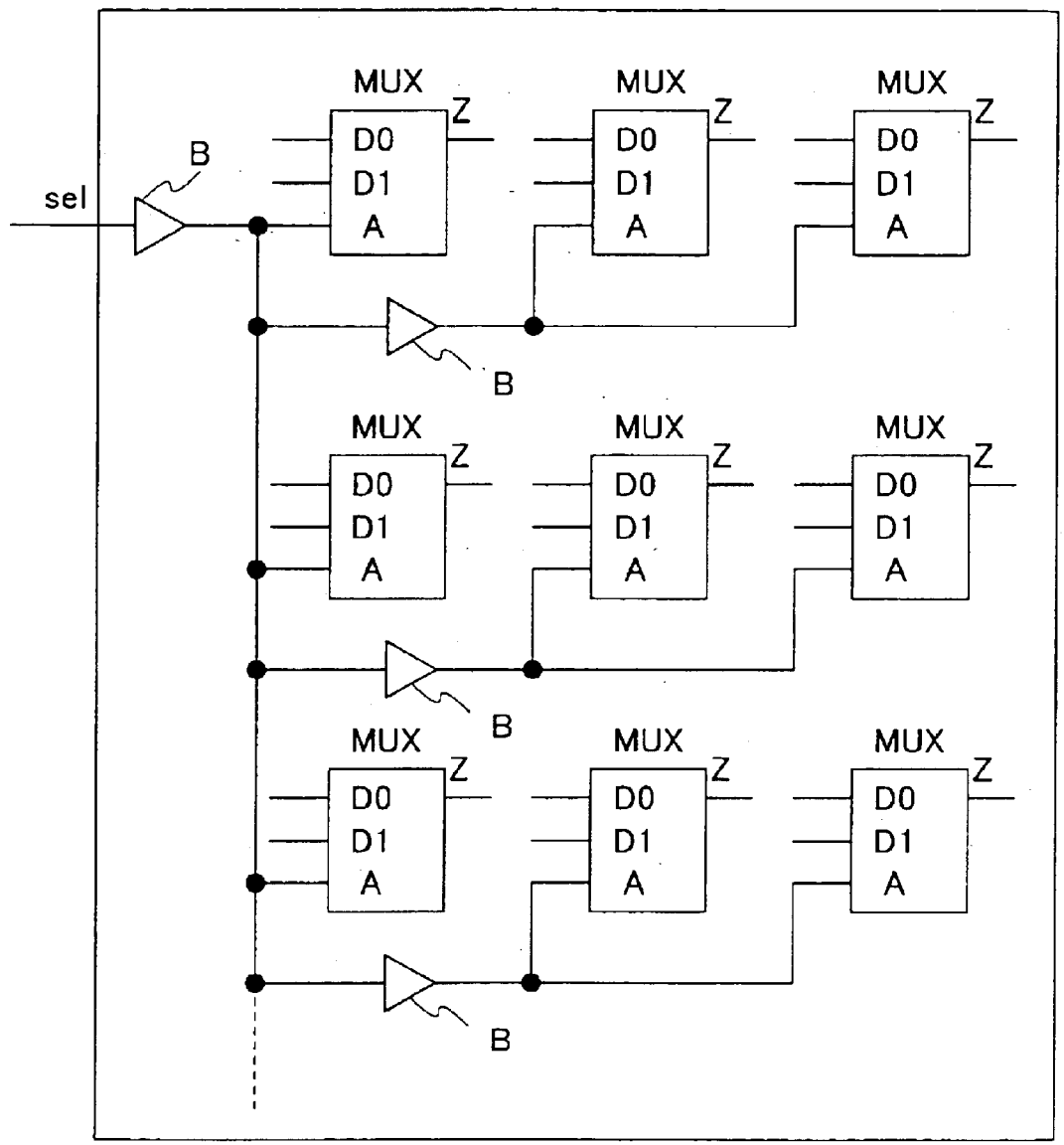
FIG. 5 shows a circuit diagram of one example of circuit configuration of a cell of the LSI circuit shown in FIG. 4 having buffers added thereto for the purpose of load sharing according to the related art.

In FIG. 3, according to a logic of a case sentence starting from line 15, signals sel[O], sel[1] are selecting signals for 64×3 multiplexers (see FIG. 4). Usually, when logic synthesis is performed thereon, as each of the signals sel[0], sel[1] should drive 64×3 cells, load sharing is performed based on load capacity data expected according to floor-planning or the like. As a result, a tree of buffers B is provided, as shown in FIG. 5.

However, this buffering may be an unnecessary one depending on layout to be performed. In order to estimate the load capacity correctly, floor-planning etc. should be performed. In fact, even if floor planning or the like is performed and thus a load capacity is estimated, the layout may be changed each time re-synthesis is performed due to occurrence of RTL modification, or re-layout is performed. In such a case, the once estimated load capacity may become not a correct one.

By such unnecessary buffering, wiring may increase and thereby, a problem of wiring confusion may arise. This problem of wiring confusion causes increase in the chip size and increase in delay occurring due to possible detour of wiring.

Figure 6:
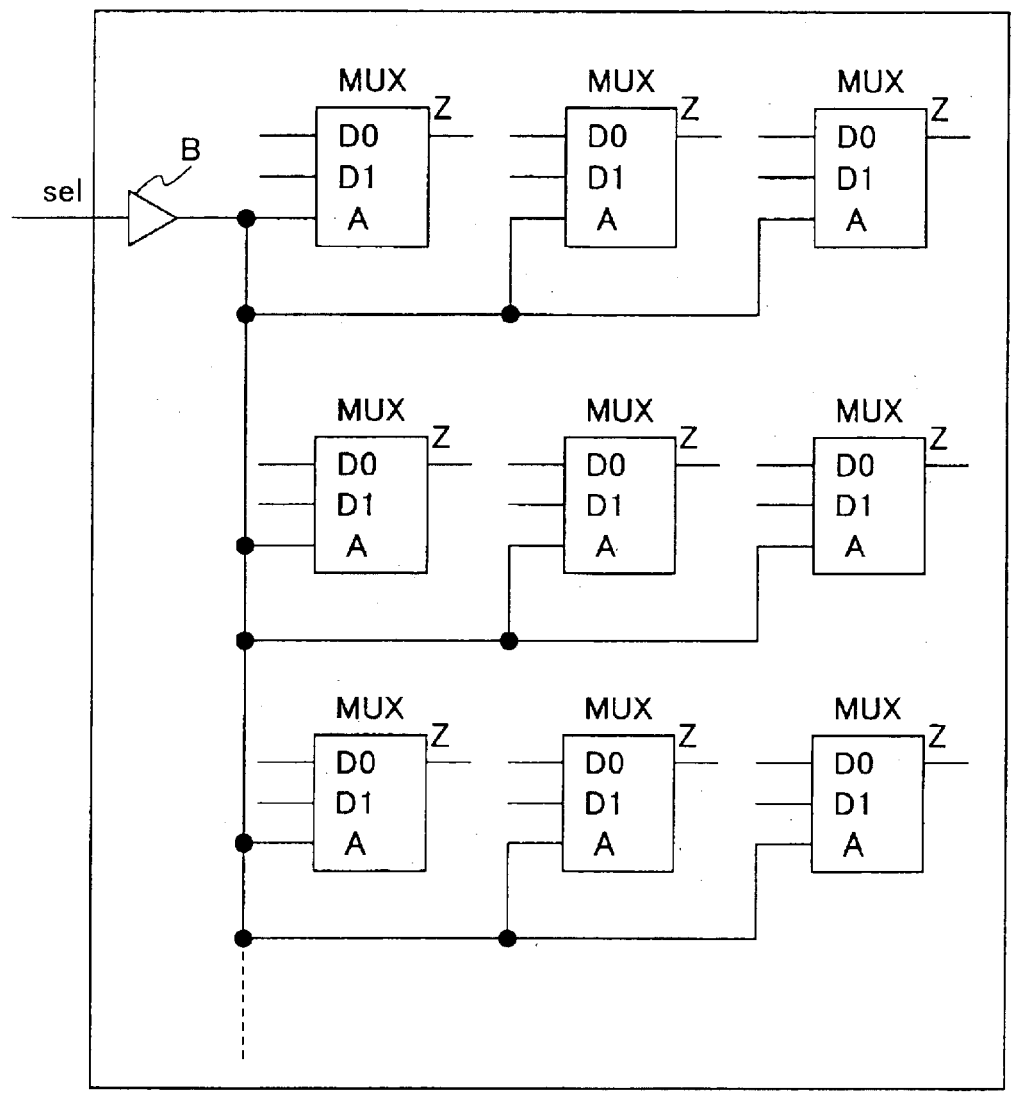
FIG. 6 shows a circuit diagram of one example of circuit configuration of the cell of the LSI circuit shown in FIG. 4 having a buffer added thereto by the logic synthesis device shown in FIG. 1, considering clock tree generated at a time of subsequent layout process.

In order to solve this problem, according to the embodiment of the present invention, in a process of logic synthesis performed by a logic synthesis part 50 of the logic synthesis device 100, load sharing is not carried out, and, instead, corresponding adjustment should be performed in the subsequent layout process. Specifically, as shown in FIG. 6, a buffer B considering a clock tree to be generated is inserted for the output of the signal sel in a step S4 by an inserting part 30.

Thereby, it becomes possible to proceed to the layout process without making unnecessary load sharing at the time of logic synthesis, and it becomes possible to actually carry out fan-out adjustment in consideration of the actual layout situation at the time of layout process. Moreover, optimum buffer insertion can be performed at the time of layout process by the clock tree generation, and the problem that buffer chain created for the purpose of unnecessary load sharing congests wiring can be prevented.

Next, the library prepared for the logic synthesis corresponding to the technology applied there is read in a step S5 by the reading part 10. Then, the thus-read library is analyzed (in a step S6) by the analyzing part 20, and, based on the analysis, a cell having a high driving capability is removed from cells to be used in the logical synthesis by a removing part 40 (in a step S7). This is because, the cell which is thus removed in the step S7 may be used in mapping thereof for coping with a problem of timing delay which may arise after the layout process.

If the cell having the maximum driving capability were already used at the time of logic synthesis, it would be not possible to cope with such a problem of timing delay. At the worst case, re-layout operation should be made. Thus, TAT should increase much. This problem can be prevented as a cell having a high driving capability is removed from cells used at the time of logic synthesis in the step S7, and, thus, it is possible to achieve optimum layout achieving timing convergence, according to the embodiment of the present invention.

Then, logic synthesis is performed in a step S8 by the logic synthesis part 50, and a net list is output therefrom in a step S9.

In addition, although Verilog is applied as the HDL in-the embodiment of the present invention, the same analysis may be made by means of another language.

Further, the present invention is not limited to the above-described embodiment, and variations and modifications may be made without departing from the scope of the present invention.

The present application is based on Japanese priority application. No. 2001-111384 filed on Apr. 10, 2001, the entire contents of which are hereby incorporated by reference.

What is claimed is:

1. A logic synthesis device comprising:
an analysis part analyzing a description of a logic design;
an extraction part extracting, based on the analysis, a part of the description of the logic design which will result in a fan-out number greater than a predetermined value;
an insertion part inserting, into the part extracted by said extracting part, a buffer considering a clock tree to be generated for an adjustment performed at a time of a subsequent layout process;
a cell removing part removing a high-driving capable cell from logic synthesis consideration for use in solving timing delays discovered in the subsequent layout process; and
a logic synthesis part performing logic synthesis on the description of the logic design obtained after the buffer insertion performed by said insertion part, wherein said logic synthesis part does not use a buffer tree and does not perform load sharing during the synthesis.

2. The device as claimed in claim 1, wherein:
said analyzing part analyzes an HDL description; and
said extraction part extracts a high fan-out net from the description.

3. The device as claimed in claim 2, wherein:
said insertion part inserts a buffer for a clock tree generated at a time of layout process into the high fan-out net extracted by said extraction part.

4. The device as claimed in claim 1, further comprising:
a part analyzing a library used for the logic synthesis by said logic synthesis part; and
a cell selecting part selecting a cell having a driving capability below a predetermined value to be used for the logic synthesis performed by said logic synthesis part.

5. A logic synthesis method comprising the steps of:
a) analyzing a description of a logic design;
b) extracting, based on the analysis of said analyzing step, a part of the description of the logic design which will result in a fan-out number greater than a predetermined value;
c1) inserting, into the extracted part, a buffer used for a clock tree generated for an adjustment performed at a time of a subsequent layout process;
c2) removing a high-driving capable cell from logic synthesis consideration for use in solving timing delays discovered in the subsequent layout process; and
d) performing logic synthesis on the description of the logic design obtained after the buffer insertion performed by said inserting step, wherein said logic synthesis does not use a buffer tree and does not perform load sharing.

6. The method as claimed in claim 5, wherein:
said analyzing step analyzes an HDL description; and
said extracting step extracts a high fan-out net from the description.

7. The method as claimed in claim 6, wherein:
said inserting step inserts a buffer for a clock tree generated at a time of layout process into the high fan-out net extracted by said extracting step.

8. The method as claimed in claim 5, further comprising the steps of:
e) analyzing a library used for said performing logic synthesis step; and
f) selecting a cell having a driving capability below a predetermined value to be used for said performing logic synthesis step.

* * * * *